United States Patent [19]

Hong

[11] Patent Number: 5,550,073
[45] Date of Patent: Aug. 27, 1996

[54] METHOD FOR MANUFACTURING AN EEPROM CELL

[75] Inventor: Cary Hong, Hsinchu, Taiwan

[73] Assignee: United Microelectronics Corporation, Taiwan

[21] Appl. No.: 499,533

[22] Filed: Jul. 7, 1995

[51] Int. Cl.⁶ .................................................. H01L 21/265
[52] U.S. Cl. ............................ 437/43; 437/49; 437/52
[58] Field of Search ................................ 437/43, 984, 49, 437/50, 52, 44

[56] References Cited

U.S. PATENT DOCUMENTS 4,988,635   1/1991   Ajika et al. .......................... 437/43

Primary Examiner—H. Jey Tsai
Attorney, Agent, or Firm—Townsend and Townsend and Crew LLP

[57] ABSTRACT

A method for manufacturing a full-feature EEPROM cell is provided, which includes the steps of forming a gate isolating layer and a conductive layer on a predetermined region of the substrate to be a selective gate of the selective-gate transistor, and thereby defining a channel region; forming a masking layer on the selective gate and the substrate; forming sidewall spacers beside the selective gate and on the masking layer, and defining a channel region of the stacked-gate transistor using the sidewall spacer, forming a stacked-gate layer on the selective gate and the channel region of the stacked-gate transistor, and implanting a second type of dopant into the substrate to form heavily doped regions by using the selective gate and the stacked gate as masks, so that each of the lightly doped regions, which may combine with one of the heavily doped regions to form a LDD structure, respectively forms sources and drains of the selective-gate transistor and the stacked-gate transistor.

7 Claims, 5 Drawing Sheets 5,550,073

METHOD FOR MANUFACTURING AN EEPROM CELL

BACKGROUND OF THE INVENTION

1. Field of the Invention

This invention relates to a method for manufacturing a full-feature EEPROM (Electrical Erasable and Programmable Read Only Memory) cell, and more particularly to a manufacturing method for a full-feature EEPROM cell which allows the device to be made smaller than is possible by conventional manufacturing techniques.

2. Technical Description

A conventional full-feature EEPROM cell comprises a selective-gate transistor 10 and a stacked-gate transistor 12 which are made on a substrate 1 as shown in FIG. 1, wherein the selective-gate transistor 10 comprises a heavily n-doped drain region 14, a heavily n-doped source region 16, a selective gate 104 formed on substrate 1 and overlying a portion of substrate 1 between drain region 14 and source region 16, and a gate oxide 102 between substrate 1 and selective gate 104. Stacked-gate transistor 12 comprises heavily n-doped drain region 16 (i.e., the source of selective-gate transistor 10), a heavily n-doped source region 18, a stacked gate including a floating gate 124, a dielectric layer 126 and a control gate 128 formed on substrate 1 and overlying a portion of substrate 1 between drain region 16 and source region 18, and a tunnel oxide 122 between substrate 1 and floating gate 124. The kind of EEPROM cell shown in FIG. 1 is referred to as "full-featured" since stacked-gate transistor 12 of the EEPROM can be erased, programmed, and is free from problems due to over-erasure of stacked-gate transistor 12 in an alternative range of a byte or multiple bytes by controlling selective-gate transistor 10.

However, the dimensions of the conventional full-feature EEPROM cell cannot be scaled down because the selective-gate transistor and the stacked-gate transistor are manufactured separately in conventional manufacturing procedures.

SUMMARY OF THE INVENTION

It is therefore an object of the present invention to provide an improved technique which overcomes the drawbacks and disadvantages associated with the aforementioned full-feature EEPROM cell.

Another object of the present invention is to provide a manufacturing method for a full-feature EEPROM cell which allows the device to be made smaller than is possible by conventional manufacturing techniques.

According to one aspect of the present invention, the channel length of the stacked gate depends on the width of the sidewall spacer of the selective gate and the self-aligned implantation of the dopant.

Other objects, features and advantages of the present invention will become apparent by way of the following detailed description of the preferred but nonlimiting embodiment.

BRIEF DESCRIPTION OF THE DRAWINGS

The following detailed description, given by way of example and not intended to limit the invention solely to the embodiments described herein, will best be understood in conjunction with the accompanying drawings in which.

In both of the figures, identical reference numerals represent the same or similar components of the overflow-indicating apparatus utilized for the description of the present invention.

DESCRIPTION OF THE PREFERRED EMBODIMENTS

The manufacturing method for a full-feature EEPROM cell of the present invention permits the formation of a selective-gate transistor and a stacked-gate transistor on a smaller region of a substrate (for example, a p-type or N-type substrate) than is possible with conventional manufacturing techniques. The method of the present invention comprises the following steps:

STEP 1

Figure 1:
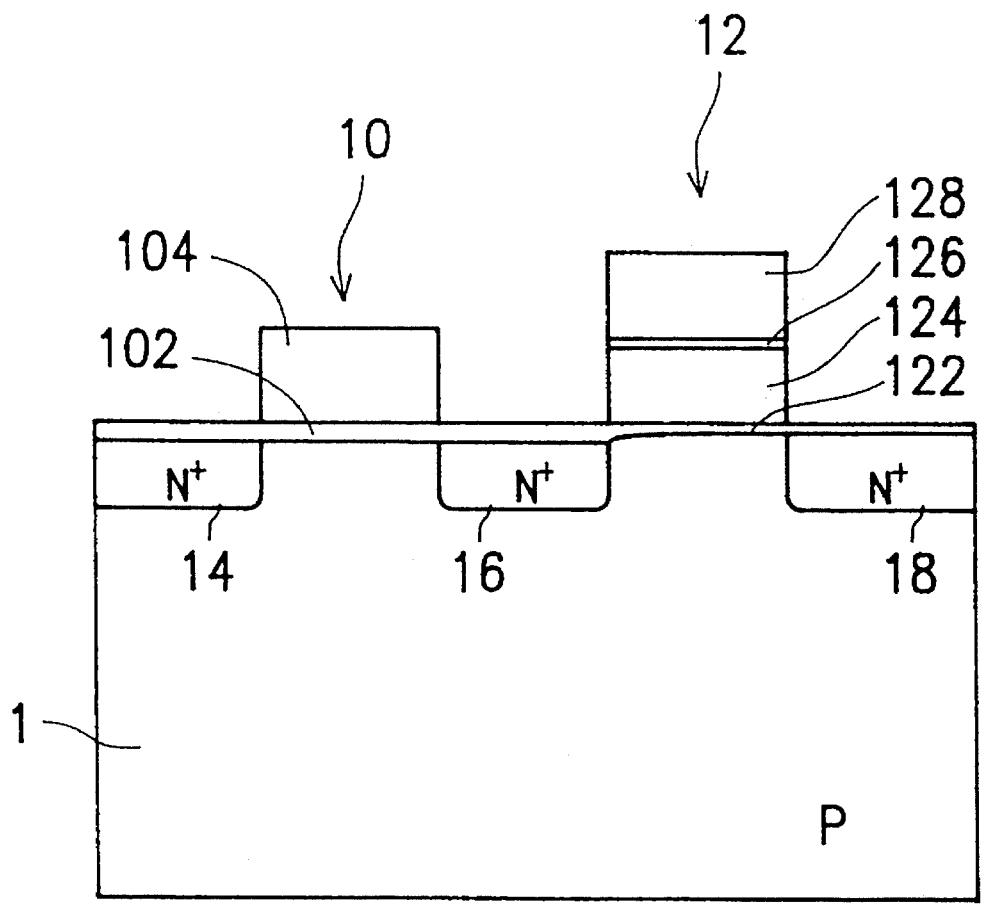
FIG. 1 schematically illustrates a cross-sectional diagram of a conventional full-feature EEPROM.
Figure 2A:
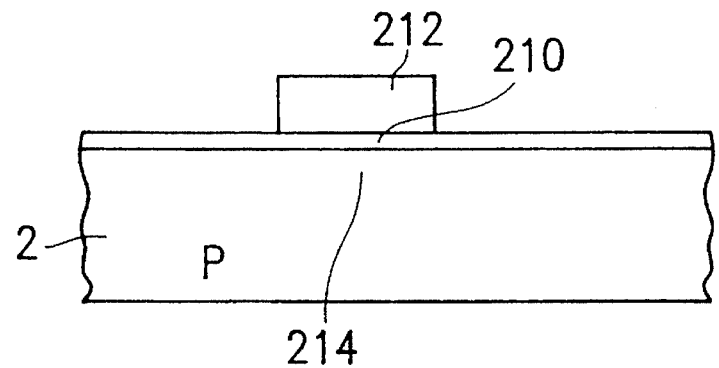
FIGS. 2a–2i show the cross-sectional diagrams of the procedures for manufacturing a full-feature EEPROM cell according to the present invention.

Referring to FIG. 2a, a gate isolating layer 210 and a first conductive layer are sequentially formed on a substrate 2. For example, using thermal oxidation, gate isolating layer 210 can be formed with a thickness in the range of about 150Å to about 300Å. The first conductive layer can be formed by depositing a polysilicon layer. A channel region 214 is defined through a photolithography process by patterning the first conductive layer. Then the first conductive layer not positioned above channel region 214 is etched away, and the remaining first conductive layer forms a selective gate 212 of a selective-gate transistor.

STEP 2

Figure 2B:
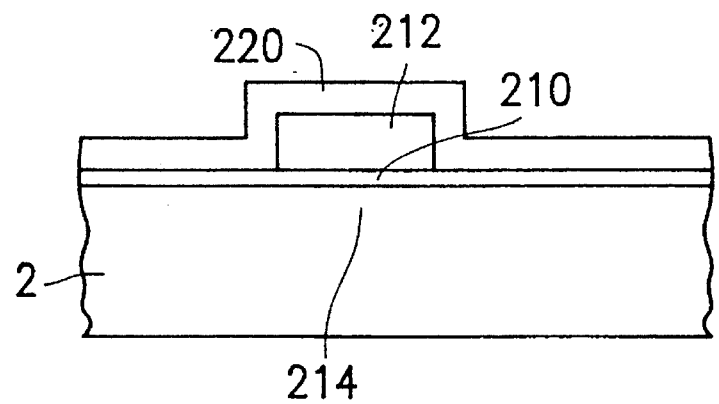

Referring to FIG. 2b, a masking layer 220 (e.g. a nitride layer) with a thickness of about 500Å to about 2000Å is deposited to cover substrate 2 and selective gate 212.

STEP 3

Figure 2C:
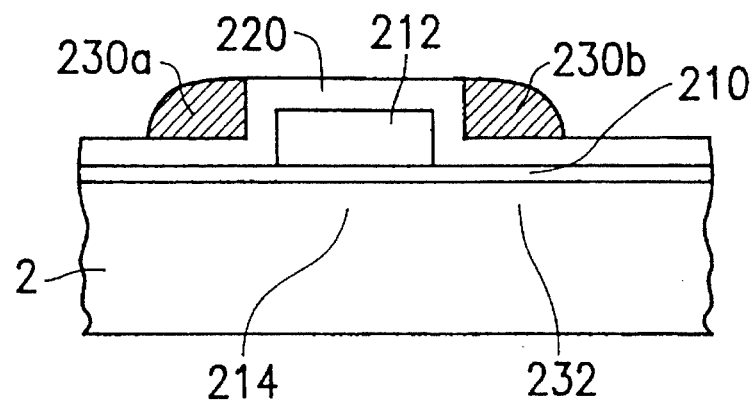

Referring to FIG. 2c, an oxide layer with a thickness in a range of about 2000Å to about 6000Å is deposited by CVD (Chemical Vapor Deposition), and then the oxide layer is etched back to form sidewall spacers 230a and 230b of selective gate 212. However, one of sidewall spacers 230a and 230b, for example, sidewall spacer 230b, is employed to define the channel region of a stacked-gate transistor.

STEP 4

Figure 2D:
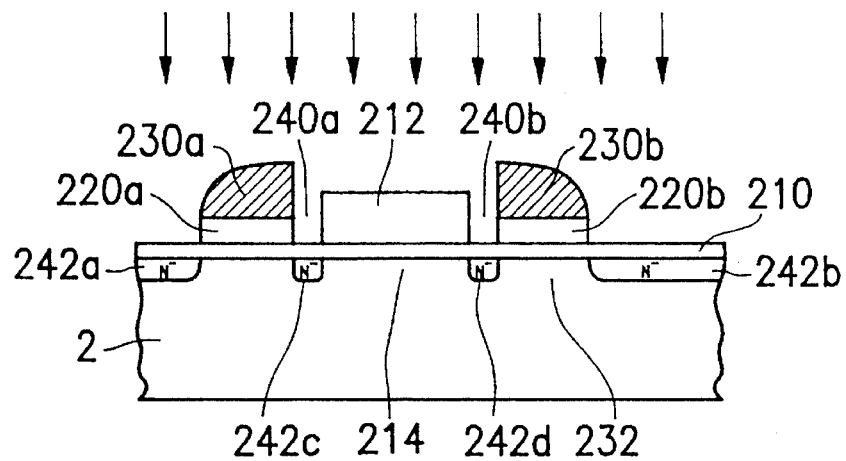

Reference is now made to FIG. 2d. Masking layer 220 (shown in FIG. 2c) is etched away beside portions 220a and 220b under sidewall spacers 230a and 230b, forming implantation openings 240a and 240b. By using selective gate 212 and sidewall spacers 230a and 230b as masks, an n-type dopant is implanted into substrate 2 through openings 240a and 240b to form lightly n-doped regions 242a–242d beside channel regions 214 and 232. For example, the dopant can be phosphorus and implanted at an energy level of about 50 KeV with a dose of about $1E14/cm^2$. The length of channel 232 is easily controllable when manufacturing since it depends on the width of sidewall spacer 230b and the self-aligned implantation of phosphorus.

STEP 5

Figure 2E:
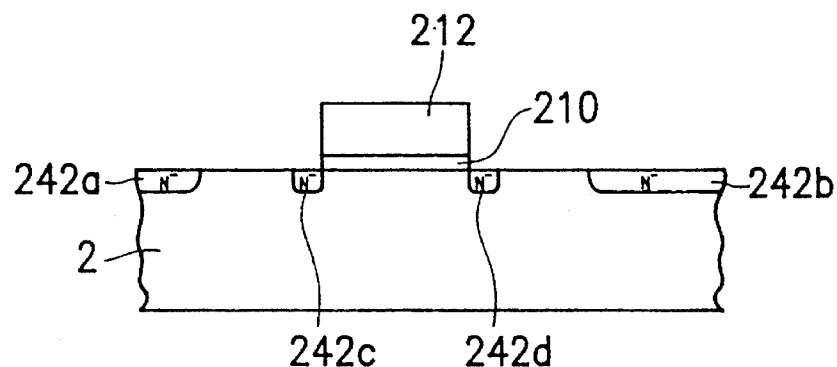

As shown in FIG. 2e, sidewall spacers 230a and 230b, masking layer 220a and 220b, and part of gate isolating layer are removed by using selective gate 212 as the mask in an etching procedure.

STEP 6

Figure 2F:
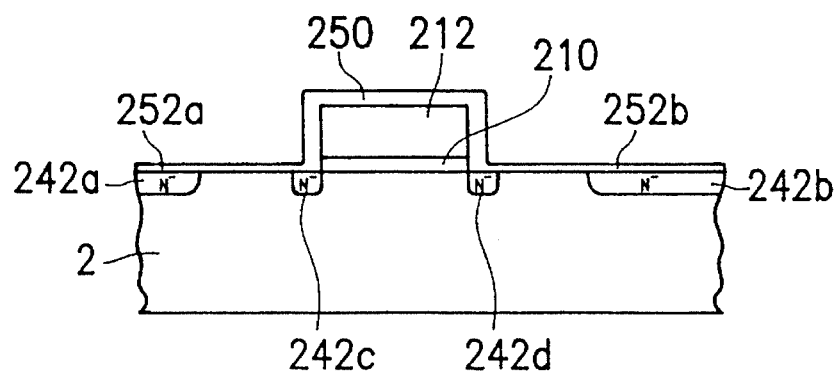

Referring to FIG. 2f, an insulating layer 250 is formed on the surface of selective gate 212, and tunnel dielectric layers 252a and 252b are formed over substrate 2. For instance, an insulating oxide is formed as the insulating layer 250 and a tunnel oxide is formed as the tunnel dielectric layers 252a and 252b using a thermal oxidation procedure. Moreover, insulating layer 250 is thicker than the tunnel dielectric layer 252a, 252b, which has a thickness in the range of about 60Å to about 120Å, because the material forming selective gate 212 is heavily doped polysilicon.

STEP 7

Figure 2G:
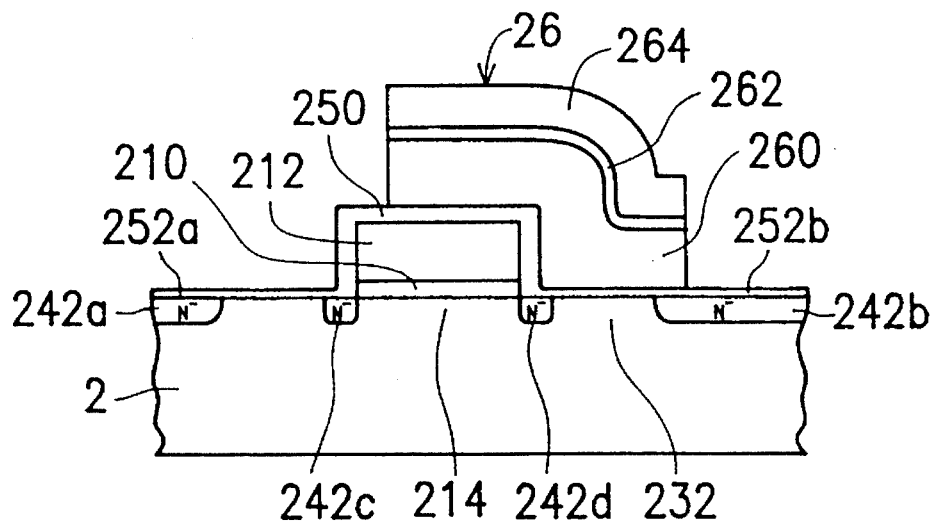

Referring to FIG. 2g, a second conductive layer 260, a dielectric layer 262, and a third conductive layer 264 are sequentially formed thereon and are defined on the selective gate 212 and the channel region 232 to serve as a stacked gate 26 of the stacked-gate transistor. For example, a first polysilicon layer, an ONO (Oxide-Nitride-Oxide) layer and a second polysilicon layer are sequentially formed on the overall surface of the cell by a photolithography procedure and an etching procedure, and are defined as stacked gate 26.

STEP 8

Figure 2H:
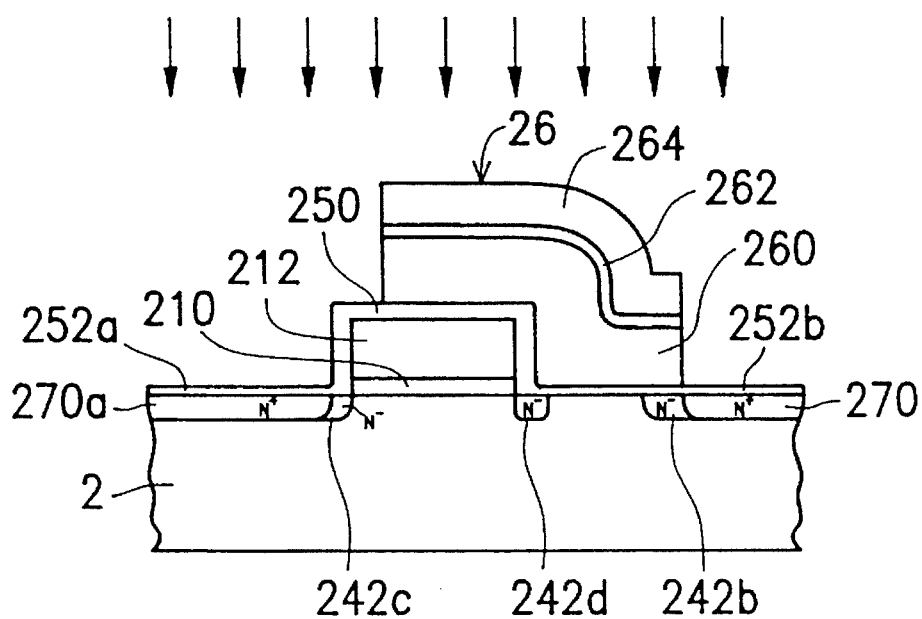

Refer to FIG. 2h. By using selective gate 212 and stacked gate 26 as masks, an n-type dopant (e.g., implanting arsenic at an energy level of about 50 KeV with a dose of about $2E15/cm^2$) is implanted into substrate 2 to form heavily n-doped regions 270a and 270b so that each of the lightly n-doped regions 242a to 242d, which may combine with one of the heavily n-doped regions 270a and 270b to form a LDD (Lightly Doped Drain) structure, respectively forms the source and the drain of the selective-gate transistor and the stacked-gate transistor.

STEP 9

Figure 2I:
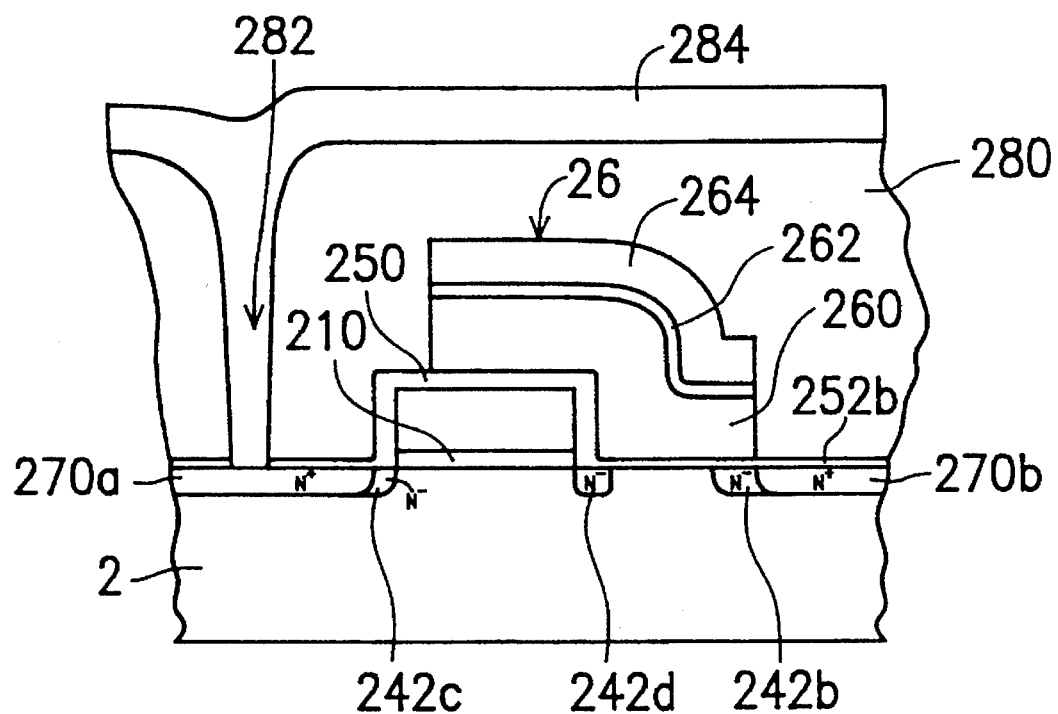

Reference is now made to FIG. 2i. The final step is passivation and metallization. That is, an insulator 280 such as SiO2, BPSG or PSG is deposited, and then insulator 280 is patterned and etched to form a contact hole 282 at a position above the heavily n-doped region. Afterward, a metal layer 284 such as aluminum is sputtered thereon.

As described above, the manufacturing method of the present invention allows the device to be made on a smaller region of the substrate since a portion of the stacked gate of the stacked-gate transistor is formed above the selective gate of the selective-gate transistor. Accordingly, this invention permits the scaling down in size of integrated circuits.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereof.

What is claimed is:

1. A method for manufacturing a full-feature EEPROM cell with a selective-gate transistor and a stacked-gate transistor formed on a first conductivity type of a substrate, said method comprising the steps of:

forming a gate isolating layer and a first conductive layer on a region of the substrate to be a selective gate of the selective-gate transistor, and thereby defining a channel region of the selective-gate transistor;

forming a masking layer on the selective gate and the substrate;

forming an oxide layer over the masking layer and then etching back the oxide layer to form sidewall spacers beside the selective gate and on the masking layer, and defining a channel region of the stacked-gate transistor underlying one of the sidewall spacers;

removing the masking layer between the selective gate and the sidewall spacers;

doping a second conductivity type of dopant into the first conductivity type of substrate to form lightly doped regions beside the channel regions of the selective-gate transistor and the stacked-gate transistor by using the selective gate and the sidewall spacers as masks;

removing the sidewall spacers and the masking layer;

forming an insulating layer covering the selective gate and forming a tunnel dielectric layer on the substrate;

forming a second conductive layer, a dielectric layer and a third conductive layer on the selective gate and the channel region of the stacked-gate transistor to serve as a stacked gate of the stacked-gate transistor; and implanting a second conductivity type of dopant into the substrate to form heavily doped regions by using the selective gate which is covered with said insulating layer and the stacked gate as masks, so that each of the lightly doped regions, which combine with one of the heavily doped regions to form a LDD structure, respectively forms sources and drains of the selective-gate transistor and the stacked-gate transistor.

2. The method of claim 1 wherein the masking layer is nitride and the sidewall spacers are an oxide.

3. The method of claim 2 wherein the first conductive layer, the second conductive layer and the third conductive layer are made of polysilicon.

4. The method of claim 3 wherein the insulating layer and the tunnel dielectric layer are simultaneously formed by thermal oxidation.

5. The method of claim 4 wherein the dielectric layer is an oxide-nitride-oxide layer.

6. The method of claim 1 wherein the first conductivity type is p-type and the second conductivity type is n-type.

7. The method of claim 1 wherein the first conductivity type is n-type and the second conductivity type is p-type.

* * * * *

UNITED STATES PATENT AND TRADEMARK OFFICE
CERTIFICATE OF CORRECTION

PATENT NO. : 5,550,073

DATED : August 27 1996

INVENTOR(S) : Gary Hong

It is certified that error appears in the above-indentified patent and that said Letters Patent is hereby corrected as shown below:

On the Title page, item [75], please delete "Cary Hong" and insert therefor --Gary Hong--.

Signed and Sealed this

Twenty-ninth Day of October 1996

Attest:

BRUCE LEHMAN

*Attesting Officer*   *Commissioner of Patents and Trademarks*